(12) United States Patent  (10) Patent No.: US 6,201,820 B1
Palmer                     (45) Date of Patent:   Mar. 13, 2001

(54) OPTICALLY MODULATED LASER BEAM TRANSCEIVER

(75) Inventor: James R. Palmer, San Diego, CA (US)

(73) Assignee: Silkroad, Inc., San Diego, CA (US)

( * ) Notice: Subject to any disclaimer, the term of this patent is extended or adjusted under 35 U.S.C. 154(b) by 0 days.

(21) Appl. No.: 09/059,842

(22) Filed: Apr. 14, 1998

Related U.S. Application Data (63) Continuation-in-part of application No. 08/811,207, filed on Mar. 5, 1997, now Pat. No. 5,818,857.

(51) Int. Cl.$^7$ .................................................... H01S 3/13
(52) U.S. Cl. .............................. 372/32; 372/34; 372/96; 372/102
(58) Field of Search .................. 372/13, 20, 29, 372/32, 34, 2, 8; 250/201.1, 211, 43.5; 181/0.5

(56) References Cited

U.S. PATENT DOCUMENTS

| | | | |
|---|---|---|---|
| H1269 | * 12/1993 | Deason | 372/13 |
| 2,945,953 | * 7/1960 | Martin | 250/43.5 |
| 3,948,345 | * 4/1976 | Rosenwaig | 181/0.5 |
| 3,986,767 | * 10/1976 | Rexer | 350/299 |
| 4,289,373 | 9/1981 | Sugimotot et al. | 350/96.16 |
| 4,431,914 | * 2/1984 | Mourou | 250/211 |
| 4,580,044 | * 4/1986 | Hongo | 250/205 |
| 4,775,971 | 10/1988 | Bergmann | 370/3 |
| 4,823,351 | * 4/1989 | Endemann | 372/20 |
| 4,862,468 | * 8/1989 | Fink | 342/19 |
| 4,884,279 | * 11/1989 | Odagiri | 372/29 |
| 4,998,259 | * 3/1991 | Chandra | 372/68 |
| 5,099,486 | * 3/1992 | Acharekar | 372/32 |
| 5,305,330 | * 4/1994 | Rieder | 372/29 |
| 5,305,334 | * 4/1994 | Margalit | 372/32 |
| 5,579,327 | * 11/1996 | Ohtateme | 372/20 |
| 5,596,436 | 1/1997 | Sargis et al. | 359/132 |
| 5,652,763 | * 7/1997 | Delfyett | 372/107 |
| 5,694,408 | * 12/1997 | Bott | 372/6 |
| 5,751,747 | * 5/1998 | Lutes | 372/2 |
| 5,866,896 | * 2/1999 | Georgiades | 250/201.1 |
| 5,978,395 | * 11/1999 | Nomura | 372/34 |
| 5,987,040 | * 11/1999 | Nesset | 372/8 |

OTHER PUBLICATIONS

Palmer, J.R., Steen, W.M., and Martellucci, S., Analytical Model For Aberrated Diffraction In High Power CW Laser Beam Trains: Laser Cavity To Work Piece, 238 Laser Applications For Mechanical Industry, 77–97, Kluwer Academic Publishers (1992).

Palmer, J.R., Continuous Wave Laser Damage On Optical Materials, 22–4 Optical Engineering, 435–446 (Jul./Aug. 1983).

* cited by examiner

*Primary Examiner*—Teresa M. Arroyo
*Assistant Examiner*—Gioacchino Inzirillo
(74) *Attorney, Agent, or Firm*—Welsh & Katz, Ltd.; Joseph R. Marcus; Jon P. Christensen (57) ABSTRACT

A method and apparatus are provided for modulating a laser beam with an information signal. The method includes the steps of modulating a plurality of coherent, optical signals with a respective information signal of the plurality of information signals and directing the modulated optical signals onto a photodiode. The method further includes the steps of detecting the collected signals in the photodiode and refractively synchronizing the laser beam with clock reference signals which allow easy separation of the modulated signal blocks at the receiving end of the fiber optic.

1 Claim, 7 Drawing Sheets

OPTICALLY MODULATED LASER BEAM TRANSCEIVER

This application is a Continuation-in-Part of Ser. No. 08/811,207 filed Mar. 5, 1997 now U.S. Pat. No. 5,818,857.

FIELD OF THE INVENTION

The field of the invention relates to lasers and in particular to the stabilization and optical modulation of lasers used for cable television transmissions.

BACKGROUND OF THE INVENTION

The use of lasers for the transmission of information in communication systems is known. Such use has typically been limited to amplitude or phase modulated systems that in use often attain a speed of several megabytes.

Laser systems in current use for communications (e.g., solid state pumped 1550 nm lasers with 150 mW output available for fiber optic communication system from Laser Power Corp., San Diego, Calif.) are typically amplitude modulated because of certain inherent limitations in a laser's ability to change frequency. Lasers, in fact, are often limited to a single frequency or a narrow range of frequencies. The tendency of a laser to operate within narrow ranges is inherent in the resonant cavity used in the generation of laser signals.

A resonant cavity of a laser is designed to amplify optical signals of a desired frequency and attenuate signals of an undesired frequency. The cavity amplifies desired frequencies through use of a laser cavity dimensioned in one-quarter wavelength increments. The closer the cavity dimensions are to a desired tolerance, the narrower the range of frequencies within which the laser will operate (the linewidth). The narrower the linewidth, the less inherent amplitude and/or phase noise will be transmitted in a laser signal. Further, the narrower the linewidth, the more power is focused into a desired center frequency.

While gas lasers have been developed with extremely narrow linewidths, solid state lasers do not perform nearly as well. Distributed feedback (DFB) semiconductor lasers, in fact, are known to have relatively wide linewidths.

As the junction current of a DFB laser is changed (or the cavity temperature changes), the operating frequency of the laser also changes. Thus, the linewidth may also vary. Static variations in the inside cavity dimensions may cause the cavity to inherently resonate at a number of frequencies. Variations in the junction current may cause a center frequency to shift (i.e., hop) from one resonant regime to another. Changes in cavity dimensions caused by temperature changes will have a similar effect.

Because of their inherent low cost and reliability, DFB lasers have an enormous potential in laser communication systems. Consequently, a need exists for a method of controlling the linewidth of DFB lasers and for efficiently modulating such devices.

SUMMARY

A method and apparatus are provided for optically modulating a laser beam with an information signal. The method includes the steps of modulating a plurality of coherent, optical signals with a respective information signal of the plurality of information signals and directing the modulated optical signals onto a photodiode. The method further includes the steps of detecting the collected signals in the photodiode and refractively synchronizing the laser beam with the detected signals.

DETAILED DESCRIPTION OF THE INVENTION

Figure 1:
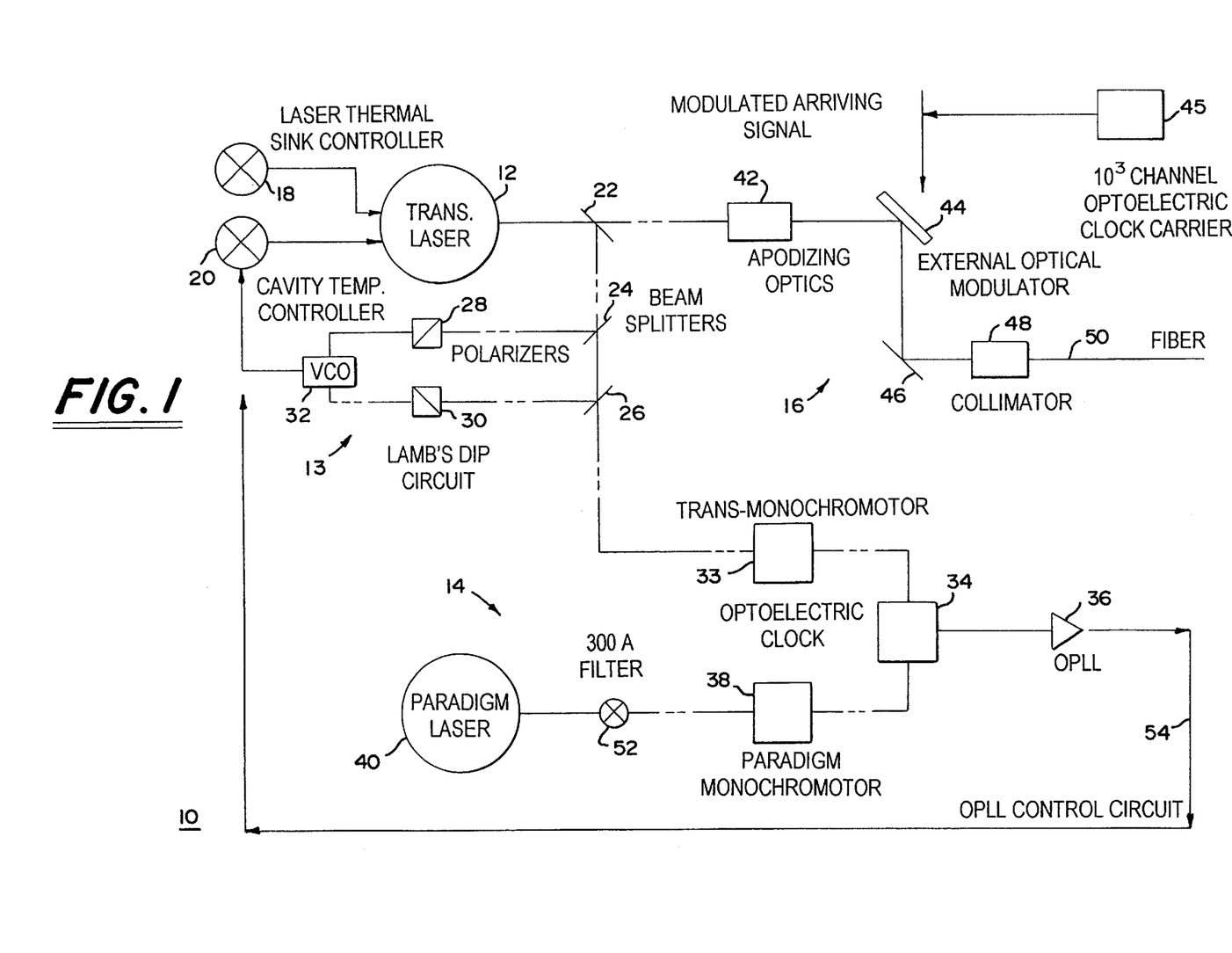
FIG. 1 is a block diagram of a stabilized laser transmission system in accordance with an embodiment of the invention.

FIG. 1 is a block diagram of a laser optical modulation system 10 generally in accordance with an embodiment of the invention. Included within the optical modulation system 10 is a transmitting laser 12, a first laser stabilization feedback section (circuit) 13, a second laser stabilization feedback section (circuit) 14 and a laser optical modulation section 16.

The transmitting laser 12 may be any distributed feedback (DFB) IR laser (e.g., 1.31 µm or 1.55 µm wavelength) compatible with an appropriate temperature control. The junction current of the laser 12 is provided by a current controlled source (not shown) supplying a rated current with no more that 0.1% ripple.

Temperature control of the laser 12 is accomplished using an active heat control device 18 and balancing heat source 20. The active heat control device 18 can be a temperature control device sometimes called a thermo-electric control or TEC located within a mounting surface (e.g., a heat sink) of the laser 12. The device 18 may be implemented using a thermocouple sensor and controller coupled to any thermally active temperature control device (e.g., a Peltier effect thermo-electric controller or heater/cooler). The operating temperature of the heat control 18 of the laser 12 may be held to an appropriate setpoint temperature (e.g., 32° F.) with appropriate limitation on temperature variation (e.g., no more than 0.1° F.).

The balancing heat source 20 is directed to stabilization of cavity dimensions by temperature control and may be implemented using an appropriately sized nichrome wire wrapped around the outside of the cavity of the laser 12 and surrounded by a thermally conductive, electrically non-conductive material (e.g., soreison, etc). The heat source 20 may be used to provide an appropriately stable cavity temperature (e.g., 32.1° F.±0.1° F.) to restrict cavity mode hopping of an output of the DFB laser 12.

The balancing heat source 20 of the first feedback circuit 13 operates in conjunction with the second feedback circuit 14 to stabilize a natural emission and node frequency of the cavity of the transmitting laser 12. While the first feedback circuit 13 uses the transmitting laser 12 as a reference, the second feedback circuit 14 compares an output of the transmitting laser 12 with an output of a paradigm laser 40.

The paradigm laser 40 may be a low power reference diode laser operating with a junction current fixed to within 0.1% and operating at 1.31 µm or 1.55 µm wavelength. The paradigm laser 40 may be calibrated using an appropriate instrument standard (e.g., a Zeiss DK-2 Spectrophotometer using a quartz-iodine lamp that is NBS traceable) to a known energy level in each wavelength. The paradigm laser 40 may also be stabilized using a temperature controlled heat sink and an active temperature controller similar to that used by the transmitting laser 12.

The fundamental problem associated with the stability of the transmitting laser 12 and paradigm laser has been determined to be control of the resonant modes operating within the cavity. Control of the resonant modes, in turn, is highly dependent upon the dimension of the laser cavity. The temperature of the cavity has been determined to be a significant factor in the cavity dimension and laser stability. Further, where attempts are made to control the cavity temperature, the cavity temperature often overshoots a set point due to the thermal lag (and thermal mass) associated with each laser 12, 40. The solution to the problem, in fact, has been found to lie in control of the cavity temperature by modeling the laser cavity as a transient thermodynamic system. Using embedded thermistors and a summing operational amplifier, it has been found that the active temperature controller 18 can be adapted to follow the transient temperature using techniques previously described by the inventor (see for example, Palmer, J. R., *Transient Heat Transfer in Flat Plates,* Vol. II Constant Temperature, Pro Se Publications, San Diego, Calif. (1995)).

In the case of a thermal system which, for the first surface, has characteristics of:

$$R_\alpha < (5\sqrt{\alpha\tau} + R_o),\ t_o < 6\sqrt{\alpha\tau}\ \text{and}\ R_o < 6\sqrt{\alpha\tau},$$

the convoluted transform will look like:

$$\Delta T_1 = \Delta T^0 \Psi_o \left( h_c \frac{\Delta T_0 \nabla \sqrt{\psi^{2.75}}\ \alpha^{\sqrt{\nu}}}{\Gamma\sqrt{K^{3.75}}} \sqrt{-\beta^{1.75} + \mu^{2.75} + \zeta^{3.75}} \right),$$

and the deconvoluted transform will have the form:

where:

$$H_o = 0.5\sqrt{\frac{\pi}{\alpha\tau}} \ = > t_0 \text{cm}^{-1},$$

$$z = \frac{t_o}{2\sqrt{\alpha\tau}} + H_o\sqrt{\alpha\tau},$$

$$x_1 = \frac{R_o}{2\sqrt{\alpha\tau}},$$

$$x_2 = \frac{R_\alpha}{2\sqrt{\alpha\tau}},$$

$$\xi x = \frac{1.0}{\sqrt{\pi}},$$

and:
$\Delta T° = T_1 - T_2$, in °C.,
$T_1$ = constant source temperature in °C.,
$t_1$ = starting temperature of the flat plate at time $\tau = 0$ in °C.,
$h_c$ = heat transfer coefficient from temperature source in W/cm$^2$°C.,
$F_{o\text{-}ang\ critical}$ = absorbed flux density in W/cm$^2$,
$\alpha$ = thermal diffuseivity of material in cm$^2$/sec,
$\tau$ = time interval that the heat source is running in seconds,
K = thermal conductivity of the material in W/cm$^2$°C.,
$t_o$ = thickness of the flat plate component in cm,
$c_p$ = specific heat of the plate material in W-sec/g°C.,
p = density of the plate material in g/cm$^3$,
$R_o$ = radius of the heat source beam on the plate per cm,
$R_\alpha$ = radius of the flat plate in cm for any thickness greater than t=0 cm.

The temperature rise at some depth into the component at t>0 will follow from $$R_\alpha < 5\sqrt{\alpha\tau}R_o,\ t_o < 6\sqrt{\alpha\tau},\ \text{and}\ R_o < 6\sqrt{\alpha\tau}.$$

$$\Delta T_1 = \left( \frac{2\left( \Delta^0 e^{\left(\frac{\tau R_0^2 \pi h_c}{\rho c_p R_\alpha^2 \pi t}\right)} - T_1 \right)\sqrt{\alpha\tau}\ \rho c_p R_\alpha^2 \pi t}{K\tau R_0^2 \pi} \Psi_o((i\text{erfc}(x)) - (i\text{erfc}(x_1)) + (i\text{erfc}(x_2))) \right) -$$

$$\left( \frac{2\left( \Delta^0 e^{\left(\frac{\tau R_0^2 \pi h_c}{\rho c_p R_\alpha^2 \pi t}\right)} - T_1 \right)\sqrt{\alpha\tau}\ \rho c_p R_\alpha^2 \pi t}{K\tau R_0^2 \pi} \Psi_o((i\text{erfc}(y)) - (i\text{erfc}(y_1)) + (i\text{erfc}(y_2)))x\left(\text{erfc}(y) - e^{(t_o H_o + H_o^2 \alpha\tau)}\text{erfc}(z)\right) \right) +$$

$$\left( \frac{2\left( \Delta^0 e^{\left(\frac{\tau R_0^2 \pi h_c}{\rho c_p R_\alpha^2 \pi t}\right)} - T_1 \right)\sqrt{\alpha\tau}\ \rho c_p R_\alpha^2 \pi t}{K\tau R_0^2 \pi} \Psi_o((i\text{erfc}(y)) - (i\text{erfc}(y_1)) + (i\text{erfc}(y_2))) \right) +$$

$$\left( \frac{2\left( \Delta^0 e^{\left(\frac{\tau R_0^2 \pi h_c}{\rho c_p R_\alpha^2 \pi t}\right)} - T_1 \right)\sqrt{\alpha\tau}\ \rho c_p R_\alpha^2 \pi t}{K\tau R_0^2 \pi} \Psi_o((i\text{erfc}(x)) - (i\text{erfc}(x_1)) + (i\text{erfc}(x_2)))x\left(\text{erfc}(y) - e^{(t_o H_o + H_o^2 \alpha\tau)}\text{erfc}(z)\right) \right),$$

The convoluted transform will have the form:

$$\Delta T_t = \Delta T^0 \Psi_o \left( h_c \frac{\Delta T_0 \nabla^{\sqrt{\psi^{3.75}}}}{\Gamma \sqrt{\kappa^{4.75}}} \right) + \Delta T^0 \Psi_o \left( h_c \frac{\Delta T_0 \nabla^{\sqrt{\psi^{5.85}}}}{\Gamma \sqrt{\kappa^{6.85}}} \right),$$

and when deconvoluted will have the form:

$$\Delta T_t = \left\{ \frac{2\left( \Delta^0 e^{\left(\frac{\tau R_0^2 \pi h_c}{\rho c_p R_\alpha^2 \pi t}\right)} - T_1 \right) \sqrt{\alpha \tau} \, \rho c_p R_\alpha^2 \pi t}{K \tau R_0^2 \pi} \Psi_o((ierfc(y_o)) - (ierfc(y_{o1})) + (ierfc(y_{o2}))) \right\} -$$

$$\left\{ \frac{2\left( \Delta^0 e^{\left(\frac{\tau R_0^2 \pi h_c}{\rho c_p R_\alpha^2 \pi t}\right)} - T_1 \right) \sqrt{\alpha \tau} \, \rho c_p R_\alpha^2 \pi t}{K \tau R_0^2 \pi} \Psi_o((ierfc(x)) - (ierfc(x_1)) + (ierfc(x_2)))x\left(erfc(y) - e^{(t_o H_o + H_o^2 \alpha \tau)} erfc(z)\right) \right\}$$

where:

$$y_o = \frac{t}{2\sqrt{\alpha\tau}},$$

$$y_{o1} = \frac{\sqrt{t^2 + R_o^2}}{2\sqrt{\alpha\tau}},$$

$$y_{o2} = \frac{\sqrt{t^2 + R_\alpha^2}}{2\sqrt{\alpha\tau}},$$

and $0 < t \leq t_o$.

As demonstrated, the active temperature controller 20 can be provided which follows the non-linear response of the thermal mass of the heat sink of the laser in real time. Using the equations demonstrated above, appropriate scaling and response factors may be provided which track the thermal characteristics of the transmission laser 12 and paradigm laser 40.

Another factor is the control of the temperature of the laser cavity using the balancing heat source 20. Control of the balancing heat source 20 is established using a first feedback loop 13 and a second feedback loop 14. The first feedback loop 13 operates by stabilizing a natural emission frequency of the atoms of the cavity with a mode frequency of the cavity.

The objective of the first feedback loop 13 is to ensure that only a single laser frequency (mode) is present and that the laser 12 is stable in producing that single mode during operation. In general, the gain region of a DFB laser must be regarded as relatively wide. As such, several longitudinal modes of operation may normally be present during operation of a DFB laser. Under the invention, the gain region of the DFB laser 12 may be narrowed by adjusting the corrugations, but temperature control is still necessary. This is because the position of the gain profile depends on the bandgap and this phenomenon is extremely dependent upon variations in temperature. Consequently, a slight change in temperature could cause the position of the gain profile to shift sufficiently to cause the laser 12 to mode "hop" to another longitudinal mode more favorably disposed with regard to the gain profile.

As a means of developing a solution to the gain profile problem, it can be assumed that a single mode is oscillating at frequency $v_m$ which is greater than the natural emission frequency of the atom, $v_o$. The natural frequency and oscillating frequency $v_m$ creates two "holes" in the distribution. The oscillation at frequency $v_m$ is a standing wave within the cavity, consisting of two waves traveling in opposite directions. The two waves can be designated by "+" and "−", respectively. Both waves have a frequency of $v_m$. The interaction of the waves traveling in the positive +vm direction with the laser medium will be greatest for those atoms that have a velocity component direction of +$v_x$, such that $$v_m = v_0 \left( \frac{1 + v_m}{c} \right).$$

There are, therefore, two groups of atoms whose stimulated emission contributes to the laser output intensity. The population inversion is reduced for these atoms and gain saturation occurs with regard to these atoms. Two "holes are burned" and they are symmetrical about $v_x=0$ and correspond to atoms with velocities of plus and minus $v_x$. Under the embodiment, we can change the frequency of the oscillating mode until the peak frequency of the laser line is equal to the natural emission frequency (i.e., $v_m=v_0$). This can be accomplished by varying the length of the cavity by small variations in the cavity temperature. In changing the temperature ever so slightly, only a single group of atoms can contribute to the lasing process, viz., those with zero-x component of velocity, and providing only a single 'hole' in the population inversion-velocity curve. When this happens, the output power has been found to drop as the available inverted population is smaller than before.

The small increase in power resulting from the slight deviation from the center frequency of the laser 12 is used as a feedback in the first feedback loop 12 to stabilize the frequency of the laser 12 at the line center by minimizing the output. Because of the power differences, any drift in the mode frequency will cause one mode to increase in power and the other to decrease. The first feedback loop 13 is used to monitor the two different power levels and to subsequently to provide a feedback signal to control the cavity length.

Fundamentally, it has been found that adjacent cavity modes are plane polarized with their planes of polarization at right angles to each other. In order to isolate and capture the two cavity modes, the output signal of the laser 12 is split into two beams in beam splitters 24, 26. A polarizer 28, 30 inserted into the path of each beam. Each polarizer 28, 30 is oriented orthogonally with respect to the other, to isolate the two adjacent cavity modes. Two matched InGaAs detectors are used to detect the two modes. The difference in the output of the detectors 28, 30 is proportional to the difference in power of the two modes.

The output of the two detectors 28, 30 is provided as an input to a differential input voltage controlled oscillator (VCO) 32. The differential input from the two detectors 28, 30 is used by the differential input VCO 32 to adjust the power to the heating coil 20 to, in turn, change the length of the optical cavity of the laser 12. This, in turn, alters the mode frequencies of the laser 12. The operation of the first feedback loop 13 has been found to stabilize the frequency of the laser 12 to within 10 Å line width.

To further stabilize the laser 12, a second feedback loop 14 is provided. Within the second feedback loop 14, an output beam of the laser 12 is compared with an output beam of a reference paradigm laser 40 and the difference provided as a second feedback signal as a further means of achieving control over the stability of the laser 12.

Using a beam splitter 26, a small portion of the output beam of the laser 12 is provided as a first input to an optoelectronic clock 34 through a first monochrometer 34. A second input to the optoelectronic clock 34 is provided from the paradigm laser 40, through a second monochrometer 38. Under the embodiment, the first and second monochrometers 34, 38 may be constructed substantially the same.

Within the monochrometer, the beam goes through a slit 50 (FIG. 2), passes through a beam expander-collimator 52 and then on to a grating 54. From the grating 54, the beam goes to a parabolic mirror 56 with a 24 cm focal length.

Figure 2:
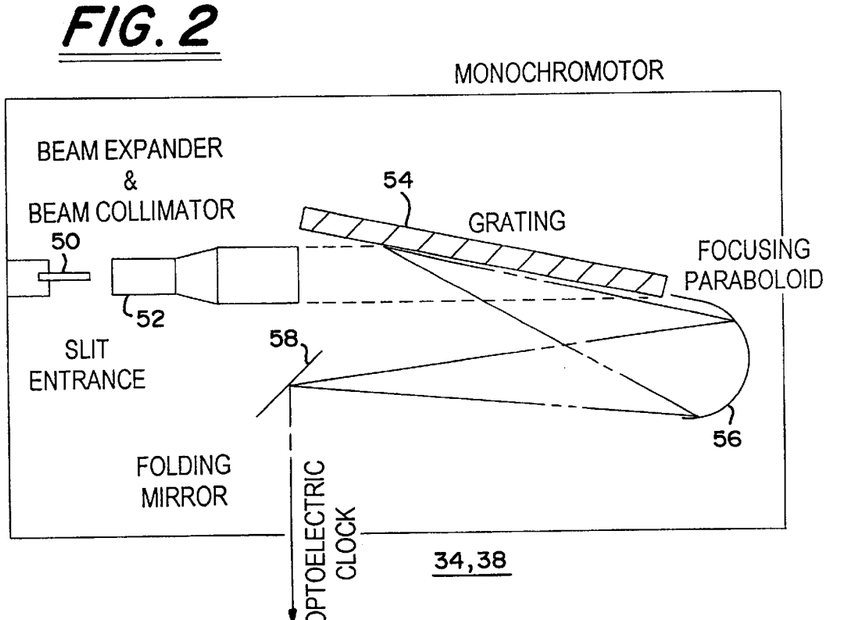
FIG. 2 is a schematic view of the monochrometer of the system of FIG. 1.

The slit 50 is fabricated with characteristics which limit the bandwidth of incident radiation. Under the embodiment, the dimensions of the slit 50 may be determined using an appropriate bandwidth limiting technique (e.g., see Richardson, D., *Diffraction Gratings,* Applied Optics and Optical Engineering, Vol. V, Part II, Optical Instruments, R. Kingslake, ed., Academic Press, New York, N.Y., (1969)).

The beam expander and collimator 52 are of conventional design for a 1.31 $\mu$m signal, using quartz optics. The grating 54 may be fabricated with a blaze angle of 24° and a line spacing of $13.4(10^3)$lines/inch or 527.559 lines/mm.

Where light is incident at an angle, $\alpha$, relative to the surface, normal to a reflecting grating, ruled with a spacing, d, the path difference for the light incident on any two adjacent grooves is $d\sin(\alpha)$. When this light is diffracted from the rulings at some other angle, $\beta$, the path difference for the light is further increased by the amount of $d\sin(\beta)$. The reflected light of wavelength, $\lambda$, will be in phase over the entire wave front when the path difference for rays incident on adjacent grooves is an integral multiple of the wavelength. For light of a given wavelength incident at a particular angle, the light reflected from all of the grooves will be in phase only at certain angles. The number of wavelengths of a path difference from adjacent grooves is called the order of interference, $m\lambda$. Using the described variables, a grating equation can be written as follows:

$$m\lambda = d(\sin\alpha \pm \sin\beta).$$

When P is equal to the blaze angle $\theta$, then $\lambda_\beta$, the first order blaze wavelength can be described as:

$$\lambda_\beta = 2d\sin(\theta).$$

For a grating 54 where $\theta$ is 24° and the grating spacing is 527.559 lines/mm, the spacing, d, is equal to 1.89553 $\mu$m. From the equation, $\lambda_\beta$ can be determined as follows:

$$\lambda_{60} = 2\,d\sin(\theta) = 2(1.89553\ \mu m)(\sin 24°) = 1.541956\ \mu m.$$

If the blazed wavelength, $\lambda_\beta$ for the condition $\alpha = \beta$ is known, and the blazed wavelength $\lambda_\beta'$ for other combinations of $\alpha$ and $\beta$ is desired, then the desired values may be determined as follows:

$$\lambda_\beta' = \lambda_\beta \cos\left(\frac{\alpha' \pm \beta}{2}\right)$$

For the particular case of $\lambda_\beta' = 1.31\ \mu m$, where we want to find the angle normal to the grating that is suitable for our wavelength, the angle may be determined by:

$$\frac{\lambda_\beta'}{\lambda_\beta} = \cos\left(\frac{\alpha' \pm \beta}{2}\right),$$

which may be simplified to produce;

$$\frac{1.31}{1.541956} = 0.843085 = \cos\left(\frac{\alpha' \pm \beta}{2}\right),$$

and $$\cos^{-1}(0.84305) = 32.53266°.$$

From this value, $\alpha'$ may be determined as follows:

$$\alpha' = 2(32.53266) + 24 = 89.9653°.$$

Another issue regarding the grating 54 is that of resolution. Using a 6 inch wide grating, the grating resolution can be determined using Fraunhofer diffraction theory from the following expression:

$$\frac{\lambda}{\Delta\lambda} = \frac{Nd(\sin\alpha - \sin\beta)}{\lambda}$$

where:

$N$ = number of grooves $\quad = 13.4(10^3)$ lines/inch $\times$ 6 inches $\quad = 80.4(10^3)$ lines, and $d$ = spacing between grooves ($\mu$)

$\quad = 1.89552(10^{-6})$ meter $\quad = 1.89552\ \mu m.$

Substituting N and d into the equation results in the expression as follows:

$$\frac{\lambda}{\Delta\lambda} = \frac{80.4(10^3)\text{ lines} * 1.89552(10^{-6})\text{ meters} * (0.9998669 - 0.4067366)}{1.30(10^{-6})\text{ meters}}$$

$$\frac{\lambda}{\Delta\lambda} = \frac{9.039294(10^{-2})\text{ meters}}{1.30(10^{-6})\text{ meters}}$$

$$\Delta\lambda = \frac{(1.31(10^{-6}) \text{ meters})^2}{9.039294(10^{-2}) \text{ meters}}$$

$$= 0.189848(10^{-10}) \text{ meters}$$

$$= 0.189848 \text{ Angstroms}$$

The resolving power of a grating is a measure of its ability to separate adjacent spectrum lines. It is expressed as $\lambda/\Delta\lambda$, where $\lambda+\Delta\lambda$ is the wavelength of a spectrum line that is just barely distinguishable from a line at wavelength $\lambda$.

Using the techniques developed herein, it should be evident that large gratings used at high angles are needed to achieve high resolving power. The actual attainment of high resolving power with a grating depends upon the optical quality of the grating surface, the uniformity of the spacing of the grooves, and the associated optical components. The equation suggests that one should be able to have an infinite resolving power simply by increasing the total number of grooves in a given width. However, there is a fundamental rule that has to be applied, (i.e., that it is absolutely necessary that the incident wavelength be less than the groove spacing (d)). If not for the fundamental rule, a grating having 4500 lines/mm would have been selected. Unfortunately, this would have provided a groove spacing of 0.222 μm, which is 5.85 times too small to provide an effective solution to the problem. Using the techniques described herein, the resolution of the laser 12 has been improved to provide a line width that is approximately 0.18696 Å $1.8696(10^{-11})$ meter. That is, the line width of the grating 54 spans the range of between 1.300018 and 1.299981 μm.

Effectively, the line width is stable to 5 parts in $10^{11}$. The approximate bandwidth can be shown as follows:

$$\Delta\Phi L = \frac{3.0(10^8)}{4\left(\frac{\Delta\lambda}{\lambda}\right)Y_m} = 2.6075(10^{15})$$

where $Y_m$=0.002, which is a dimensionless material dispersion coefficient.

As mentioned above, the paradigm laser 40 is a low power diode laser operating at 1.31 μm wavelength. Prior to entry into the paradigm monochrometer 38, the laser beam from the paradigm laser 40 is passed through a 300 Å line filter as a rough control before entry into the monochrometer 38.

Figure 3:
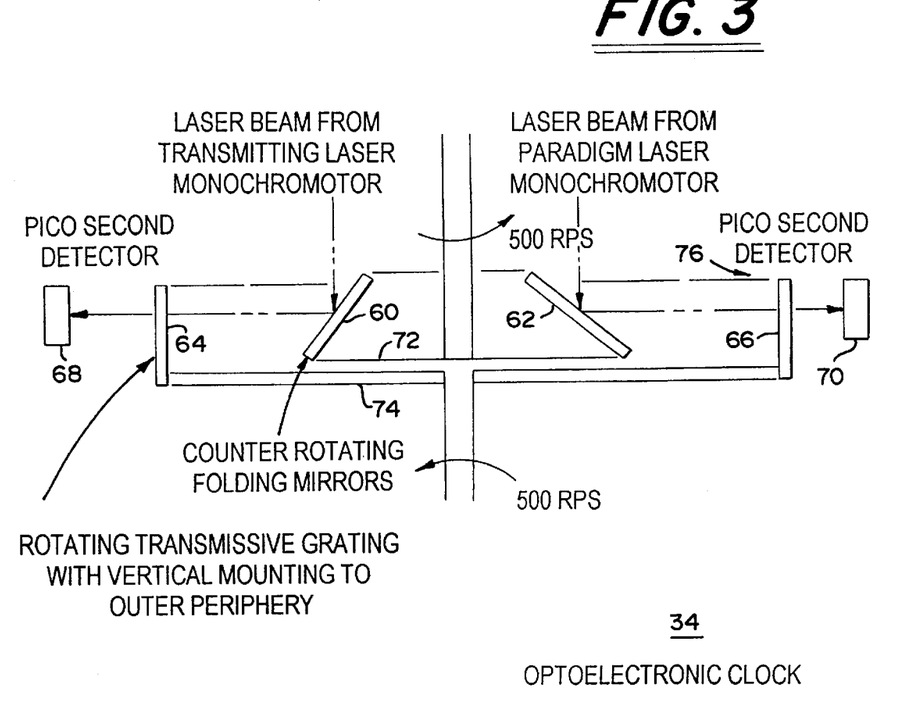
FIG. 3 is a cut-away side view of the optoelectronic clock of FIG. 1.

Within the monochrometer 38, the beam passes through the expander-collimator 52, onto the grating 54, and is reflected from the parabolic mirror 56, as described above and is passed on by the rotating mirrors 62 and grating 66 of the optoelectronic clock 34. After passing through the grating 66, the beam strikes a InGaAs detector 70 matched to another InGaAs detector 68 detector on the other side of the optical phase lock loop 36. As mentioned above, the paradigm laser 40 is calibrated using the Zeiss DK-2 Spectrophotometer to precisely determine the optical output of the laser 40.

With the transmitter laser 12 slaved to the paradigm laser 40 through the optical phase lock loop 36, the variable controlled output 54 will feed back to the cavity temperature control 20 of the transmitter laser 12 as small increments of voltage control on the heating element surrounding the optical cavity of the transmitting laser 12. In this manner, it has been found that temperature (and length) of the cavity can be more precisely controlled. The feedback signal 54 of the second feedback circuit 14, in fact, has been found to provide a granularity of control 53 times better than the first feedback circuit 13.

Turning now to the optoelectronic clock 34, the optoelectronic clock 34 forms a portion of the second feedback circuit 14. For purposes of simplicity, FIG. 3 will be used to explain this function.

The essence of the clock 34 is two counter-rotating disks 72, 74. The two disks 72, 74 may be driven by variable speed motors (e.g., Dremel motors). The variable speed capability of the disks 72, 74 is such that the speed may be continuously varied from a low of 83.33 revolutions per second (rps) to 500 rps. Under an embodiment, the speed of the inner disk 72 is chosen to be 500 rps. The two disks 72, 74 rotate in opposite directions.

A number of mirrors 60, 62 are mounted to the inner mirror disk 72. More specifically, sixteen mirrors 60, 62 are mounted at a 45° angle to a rotational axis of the disk 72 around the periphery of the disk 72 at a radius of 63.5 mm. The mirrors 60, 62 are mounted such that a light beam traveling parallel to the axis of rotation of the disk 72 would be reflected radially through a rotating transmissive grating 64, 66 on the second disk 74 at a predetermined angle of the disks 72, 74 to strike a set of stationary detectors 68, 70.

The second disk 74 rotates at a speed of 500 rps. The second disk may be equipped with an annular ring 76 of a radius of 97.0209 mm, fitted with a rotating transmissive grating 64, 66.

The total cycles per second produced by the optoelectronic clock 34 may be determined by the equation;

$$v_o = \alpha\beta(N_m X + Y),$$

where:
α=grating lines/mm,
β=circumference of the second disk,
X=rps of the mirror disk,
Y=rps of the second disk and
$N_m$=number of mirrors on the mirror disk.

For X and Y of 500 rps with 16 mirrors on the inner rotating shaft and a second disk of circumference 609.60029 mm with a grating density of 905.5 lines/mm, the output frequency $v_o$ is 4,969,194,103 Hz or 4.969 GHz. As should be apparent from the equation, the frequency of the signal detected by the detectors 68, 70 can be adjusted by changing the gratings, the number of mirrors, the radius of the mirrors, or the radius of the grating. Having passed through the grating 64, 66, the laser beam strikes the detectors 68, 70 providing an electrical signal that is conditioned and amplified to establish a particular tuning frequency.

For purposes of the second feedback circuit 14 alone, the speed of the counter-rotating disks 72, 74 is not considered critical. As a consequence, the disks 72, 74 may be operated at a speed convenient for generation of reference frequencies. Of more importance for purposes of the second feedback circuit 14 is the ability of the disks 72, 74 to chop a light beam from both the transmitting laser 12 and from the paradigm laser 40 into light pulses that may be compared as to phase and intensity.

Figure 4:
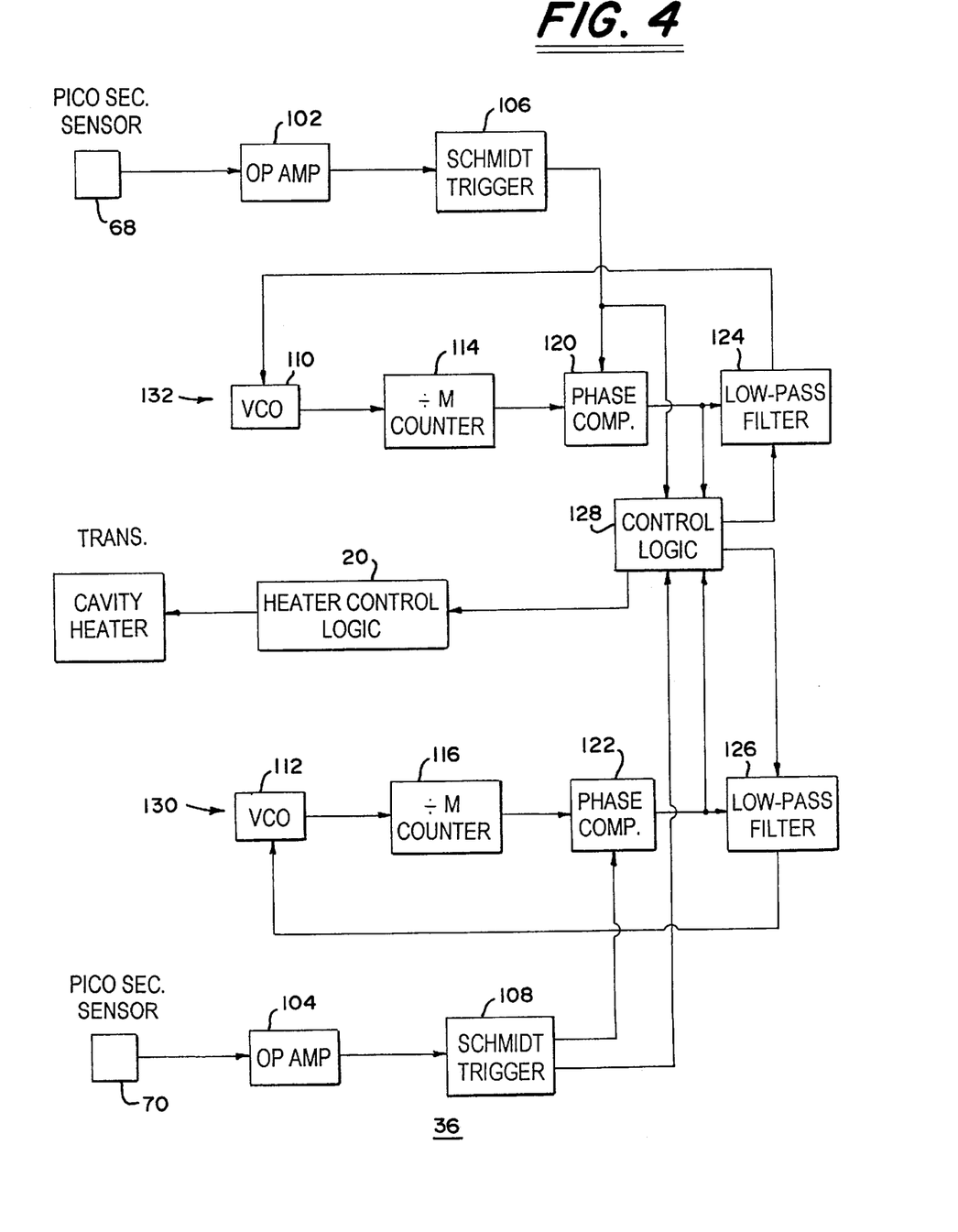
FIG. 4 is a block diagram of the phase lock loop of FIG. 1.

FIG. 4 is a block diagram of the phase lock loop circuit 36.

As shown, an output of the sensors 68, 70 is shaped within an op amp 102, 104 and Schmidt trigger 106, 108. The shaped pulses are passed through a loop filter 130, 132 before comparison in a control logic section 128.

From the detectors 68, 70, the level of the signal requires amplification to raise the signal to a sufficient level to trigger the Schmidt trigger 106, 108. The signal from the detector 70 of the paradigm laser 40 uses a non-inverting op amp 104. The signal from the detector 68 of the transmitting laser 12 may use an inverting op amp 102. It should be noted that it is not all that important that the input signal from the detectors 68, 70 match, but only the square wave of the Schmidt triggers 106, 108 substantially match.

The loop filters 130, 132 provide a means of averaging an output of the phase lock loop 36. A signal from the loop filter 130, 132 is compared with an output of the Schmidt trigger 106, 108 in control logic 128 (e.g., an XOR gate) to identify and reinforce coincidence of phase and amplitude relationships between the transmitting laser 12 and paradigm laser 40. The output of the control logic 128 is then scaled and provided as a control output of the second feedback circuit 14 through the heater control logic 20.

Figure 5:
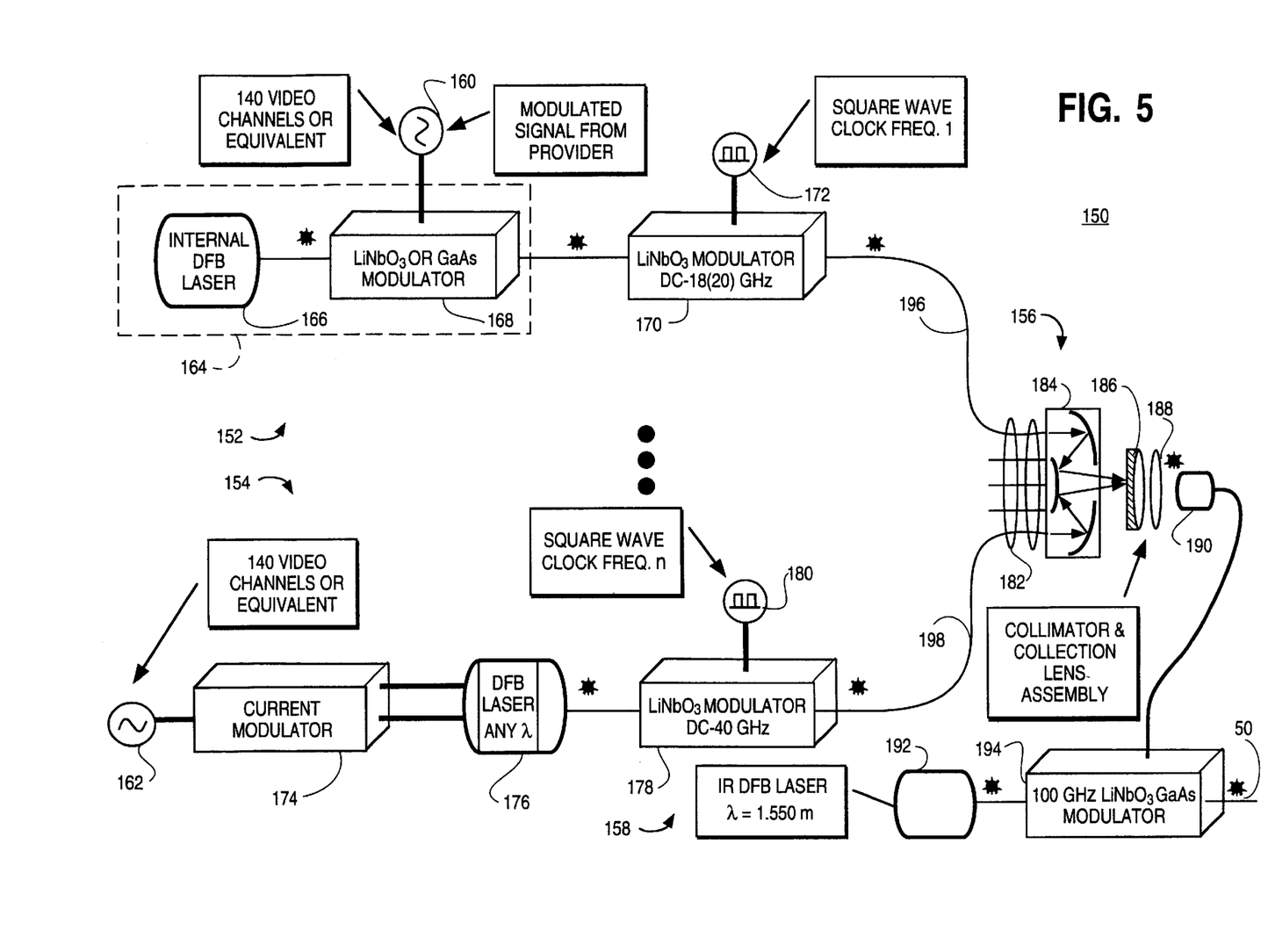
FIG. 5 depicts a block diagram of an alternate optical modulator embodiment of the system of FIG. 1.

FIG. 5 is a block diagram of an illustrated example 150 of the laser modulation section 16 of the system of FIG. 1. While the modulator 44 of FIG. 1 is shown functionally in the form of a mirror which modulates a phase of an incident light beam based upon movement of the mirror's surface, it is to be understood that the laser modulator section 16 may be implemented under any of a number of formats (e.g., the systems shown in FIGS. 4–5).

Similarly, the optoelectronic clock 45 may also be implemented under a number of formats. Under the embodiment, a predetermined number of information channels (e.g., 140 television signals) of an appropriate bandwidth (e.g., 6.2 MHZ each) may be grouped and be used to modulate an optical subchannel (e.g., of a 1 GHz bandwidth). A number of subchannels, in turn, may be combined and transmitted over the fiber 50. Each optical subchannel may be generated through the use of its own clock reference 45 which clock reference signal may be included as a portion of the information on the subchannel and recovered as a timing reference at a receiver.

The optoelectronic clock 45 may be implemented using a suitable high frequency reference (e.g., a quartz crystal) and a number of frequency multipliers to generate a multitude of reference clock frequencies from a base frequency. For example, phase-locked loop (PLLs) frequency multipliers are known which use integer dividers in a feedback path and a voltage controller oscillator (VCO) in a feedforward path to generate stable multiples of a base clock frequency. Alternatively, fractional frequency dividers using sigma-delta modulation of the feedback divider may be used for the generation of sub-integer multiples of the base frequency.

Under the illustrated embodiment of the modulator 150 of FIG. 5, a number of optical subchannels 1-n (two channels 152, 154 shown in FIG. 5) may be combined within a combiner 156. An output signal of the combiner 156 may be used to modulate a transmission laser 158. Each optical subchannel 152, 154 in turn may be used to encode a block of information signals from a signal provider 160, 162.

Where the signal provider 160, 162 is a television signal source, the signal from the provider 160, 162 may include up to 140 channels, with a bandwidth per channel of 6.2 MHZ. Encoding of the channels into a spectral information block by the signal provider 160, 162 may be accomplished under any of a number of formats (e.g., frequency division multiplexing (FDM)). Where FDM is used, the first channel may occupy a center frequency of 3.1 MHZ. A 1 MHZ guardband may be provided between an upper frequency limit of the first channel and a lower frequency limit of the second channel (i.e., between 6.2 and 7.2 MHZ). The second channel may occupy a center frequency of 10.3 MHZ. The third channel may occupy a center frequency of 17.5 MHZ, and so on. Including guardbands, the modulated signal from the provider 160, 162 may have a total bandwidth of approximately 1 GHz.

Modulation of the signal from a signal provider 160, 162 onto an optical subchannel 152, 154 may be accomplished under any of a number of methods. Under a first method, an electro-optical differential multiplexer 168 may be used to encode (e.g., refractively synchronize) the signal from the signal provider 160 onto a laser signal from a first laser source 166 of the first optical subchannel 152.

The electro-optical differential multiplexer may be any electro-optical device capable of modulating an optical signal with a controlling electrical signal through refractive synchronization. For example lithium niobate ($LiNbO_3$) or gallium arsenide (GaAs) crystals are known to have such characteristics. Suitable devices for use with the modulator 150 include those devices with a suitable radio frequency (RF) interface and internal laser source or optical interface for an external laser source (e.g., a Marconi Model Lt 7000 with External Modulator, External Modulator by UTP SITU, Marconi LC 1000, etc.).

Optical refractive synchronization is a process whereby a controlling signal is used to modulate an optical signal. Fundamentally, the process of refraction is the change of energy, direction or speed of a light beam which is propagating through a medium. In a first case, the change in direction may be a continuous bending of the light beam and of the subsequent change of the speed of light in the medium which is referred to as the index of refraction of the material. In a second case, there is an abrupt change in the index, polarity, or phase of the medium which directs the energy out of the medium, or changes the ability of light to pass through the medium, thereby absorbing the energy. This second case is the technique employed in optical refractive synchronization. The light is passed through a crystal which has the refractive index changed abruptly, by imposition of an electric field, by passing a controlling signal through the crystal, which then causes the crystal to allow the light to pass through, or be absorbed in the crystal at the frequency of the controlling signal. This optical modulation is performed, therefore, through control of the refraction and polarization characteristics of the optical crystal.

By combining the frequencies of various sources and optically modulating them onto a respective clock frequency with an appropriate sampling frequency and amplitude ratio, it is possible to synchronize all of the information signals to their respective optical light beams. It then also becomes possible to combine them with other light beams with similar optical modulation at singularly different clock frequencies and to nest these optically modulated beams onto yet another yet higher clock frequency by using optical diffractive synchronization.

Once the signal from the laser 166 is modulated with the information signal by refractive synchronization, the signal may be sampled within a second electro-optical differential multiplexer 170 (e.g., an External Modulator by UTP SITU APE, Marconi LC 1000, etc.). Sampling may be accomplished at any clock frequency with an appropriate sampling rate as determined from the Palmer Sampling Modulation Transfer Function equation as follows:

$$f_{0sample} = \frac{2}{\pi}\left(\cos^{-1}\left(\frac{A}{A_0}\right) - \left(\frac{A}{A_0}\sqrt{1.0 - \left(\frac{A}{A_0}\right)^2}\right)\right)$$

where A is the modulated signal amplitude, Ao is a clock frequency amplitude.

For the case where a noise signal is included as part of the baseband signal, the equation can be modified as follows:

$$f_{0sample} = \frac{2}{\pi}\left(\cos^{-1}\left(\frac{A}{A_0}\right) - \frac{A}{A_0}\sqrt{1.0 - \left(\frac{A}{A_0}\right)^2}\right)\left(\left(\frac{2J_1(M)}{M}\right)\left(1.0 - \frac{A}{A_0}\right)\right)$$

where M is $8\pi\delta A/A_o$ and $\delta$ is baseband noise amplitude/$2A_o$ and $J_1(M)$ is a Bessel Function of the First Kind of Order 1. Further, a required minimum clock sampling frequency for $A_0=(1/f_{0sample})f_{max}$ where $f_{max}$ is the highest frequency represented in the modulated signal A. From a practical point of view the best results have been found to occur where $A/A_o<1.0$ (i.e., the clock amplitude $A_o$ is 2.0 to 7.0 times larger than the modulated signal amplitude A).

Further, since the sampling multiplexer 170 also functions to shift a subchannel operating frequency to a non-interfering spectral location for transmission through the optical cable 50, the frequency of the square or sine wave clock 172 must be chosen with consideration given to adjacent subchannels (e.g., the second subchannel 154).

For example, where a bandwidth of the signal provider is in the area of 1 GHz, a frequency chosen for the first clock 172 may be 2.5 GHz. A frequency chosen for a second subchannel may be 3.6 GHz. A third subchannel (not shown) may be 4.7 GHz. Given that the channel capacity of the modulator 150 is believed to be 2200, or more, television signals (and using 140 television signals per subchannel) the number of subchannels 152, 154 that may be used in the modulator 150 may be up to, or exceed, 16. Clock frequencies that may be used by subchannels 4–16 may be as follows: 5.8 GHz, 6.9 GHz, 8.0 GHz, 9.1 GHz, 10.2 GHz, 11.3 GHz, 12.4 GHz 13.5 GHz, 14.6 GHz, 15.7 GHz, 16.8 GHz, 17.9 GHz and 19.0 GHz. However, these values are nominal and will be increased greatly by using 60 GHz or 100 GHz modulators.

When imposing signal modulations or carrier clock frequencies using a 12 GHz modulator or better, it is possible to synchronize two clock signals 180 degrees out of phase via selective time delays constructed with differing lengths of fiber optic. Such synchronization may be implemented, for instance, by adjusting a length of the optical fiber between the first and second clock modulators 402, 404 shown in FIG. 9. Such method may be useful to speed up the reference clocks with only limited bandwidth on the clock sources and modulators.

Figure 9:
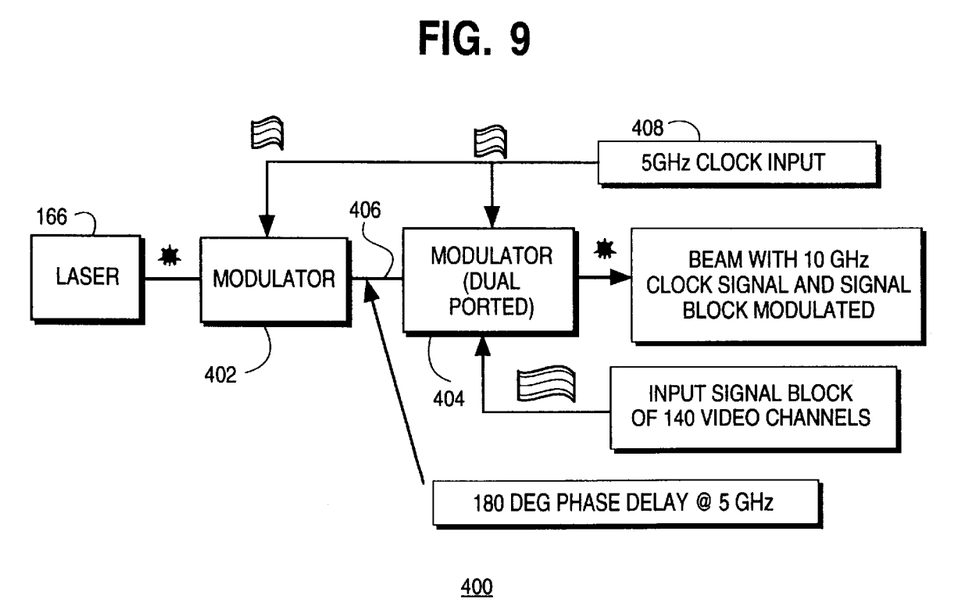
FIG. 9 depicts apparatus for generating even-powered, higher multiples of a base band clock frequency for use with a modulator of FIG. 1.

The index of refraction of the 5 $\mu$m core of a fiber optic at 1.550 nm is assumed to be 1.458. Since this index of refraction represents the relative slowing of the velocity of propagation from that of free space, we can easily calculate the length of fiber optic necessary to induce a 180 degree delay at 12 GHz. The period of a 12 GHz wave is $1/(12.0 (10^9)\text{Hz})=83.33(10^{-12})$ sec. So the delay required is one half of 83.3 ps=41.667 ps. Since light travels at 299,776 km/s or approximately $3.0(10^{10})$ cm/s, a delay of 41.667 ps represents about 8.5695 mm of fiber optic between modulators Since $(3.0(10^{10})$ cm/s/1.456)*(41.667 ps)=8.5696 mm. The fiber can be of length N*1.71392 cm+8.5696 mm where N is an arbitrary integer and still work correctly to multiply the two source signals together. There is nothing sacrosanct about 12 GHz. The same technique may be used for 60 or 100 GHz modulators, etc.

Under the technique of FIG. 9, a higher even-powered ($2^n$, n=1,2, . . . ) multiple of a base band clock frequency signal may be delivered to the final dual-ported information encoding modulator 404 from a lower frequency clock source 408 based upon the phase delay implemented by lengths of fiber optic cable 406 between ($2^n$-1) type 402 (single port) modulators in the chain of $2^n$ modulators terminated by a single type 404 (dual ported) modulator. The phase delay implemented by the length of fiber between adjacent modulators is $2\pi/2^n$ radians, where n is an integer. For example, the 5 GHz source 408 can provide a doubled 10 GHz ($2^1$ times 5 GHz) to the modulator 404 based upon a 180 degree (n radians=$2\pi/2^1$ radians) phase shift provided by the proper length of fiber 406. If there were four modulators consisting of three type 402 and one type 404 (n=2, therefore a total of $2^2$ modulators required) with the phase delay between adjacent modulators of 90 degrees (or n/2 radians=$2\pi/2^2$ radians), then a 20 GHz clock signal would be delivered to the last (dual-ported) modulator 404 from a 5 GHz baseband clock frequency source 408. In general, any clock source 408 may be scaled upwards by a multiple of $2^n$ using a total of $2^n$ modulators $2^n$-1 of type 402 and one of type 404 with n a positive integer, the last modulator 404 of which is dual ported to also allow input of the signal block.

With regard to FIG. 5, the multi-channel modulator 400 of FIG. 9 may be used in place of the subchannel modulator 152. More to the point, a number of subchannels 152 (operating on different subcarrier frequencies) may be provided by the multi-channel modulator 400 where the only differences between modulators 400 are the number of modulators in the chain (divisible by $2^n$) and the length of the optical fibers 406 between them.

Under another illustrated embodiment, the subchannels 152, 154 may encode a signal from a signal provider 162 using direct current modulation. Under the embodiment, a current driver 174 is interposed between the signal provider 162 and DFB laser 176. The current driver 174 modulates a junction current of the DFB laser 176 in a known manner to frequency modulate the optical signal with the information signal (e.g., 140 television signals).

To further improve the performance of the subchannels 152, 154, the DFB lasers 166, 176 may be stabilized to reduce frequency drift due to environmental factors. Stabilization techniques that may be applied may include the temperature control systems described with reference to the stabilized laser 12 including modulators. More specifically, the techniques described in association with reference laser 12 may be advantageously applied to any laser application described herein, including modulators.

Following modulation of the subchannels 152, 154 by information signals from the signal providers 160, 162, the information of the subchannels is combined. Combining may be accomplished by bringing the optical signals of the subchannels together and detecting the transmissions of each subchannel in a high speed photodiode 190.

The step of bringing an optical signal of each subchannel 152, 154 together may be accomplished through the use of Cassegrain collection optics. To use the Cassegrain collection optic, an output end of an optical cable 196, 198 of each subchannel is collected and the body of each cable 196, 198 held in a parallel relationship with the bodies of the cables 196, 198 together forming a cylindrical shell 182 at an input to the Cassegrain collector 184. The output end of each cable 196, 198 combines with the output ends of other cables of other subchannels to form an annular ring with an output of each cable directed into the collector 184.

The signals from the subchannels 152, 154 strike a first and second parabolic mirrors, followed by a collimating and collection lens assembly 186, 188. The combining of the optical signals occurs upon detection of the signals within the photodetector 190.

The photodetector 190 may be any high-speed (e.g., 60 GHz) integrating photodiode. The photodiode, for example, may be a Newport Model PX-D7, or equivalent.

The signals combine in the photodiode 190 to form a modulation signal that, in turn, may be used to drive and frequency modulate a signal from a final transmission laser 192. The transmission laser 192 may be any solid state laser, but in one preferred embodiment is a 1.550 μm DFB laser; another embodiment would be a 1310 nm laser.

The modulator 194 may be a LiNbO$_3$, GaAs, or equivalent crystal and may function as an electro-optical diffraction multiplexer. Since the modulator 194 must operate at a higher speed (e.g., 100 GHz), it may be of a high speed variety (e.g., a Marconi LC 1000 Series Special, UTP SITU APE, etc.).

Figure 6:
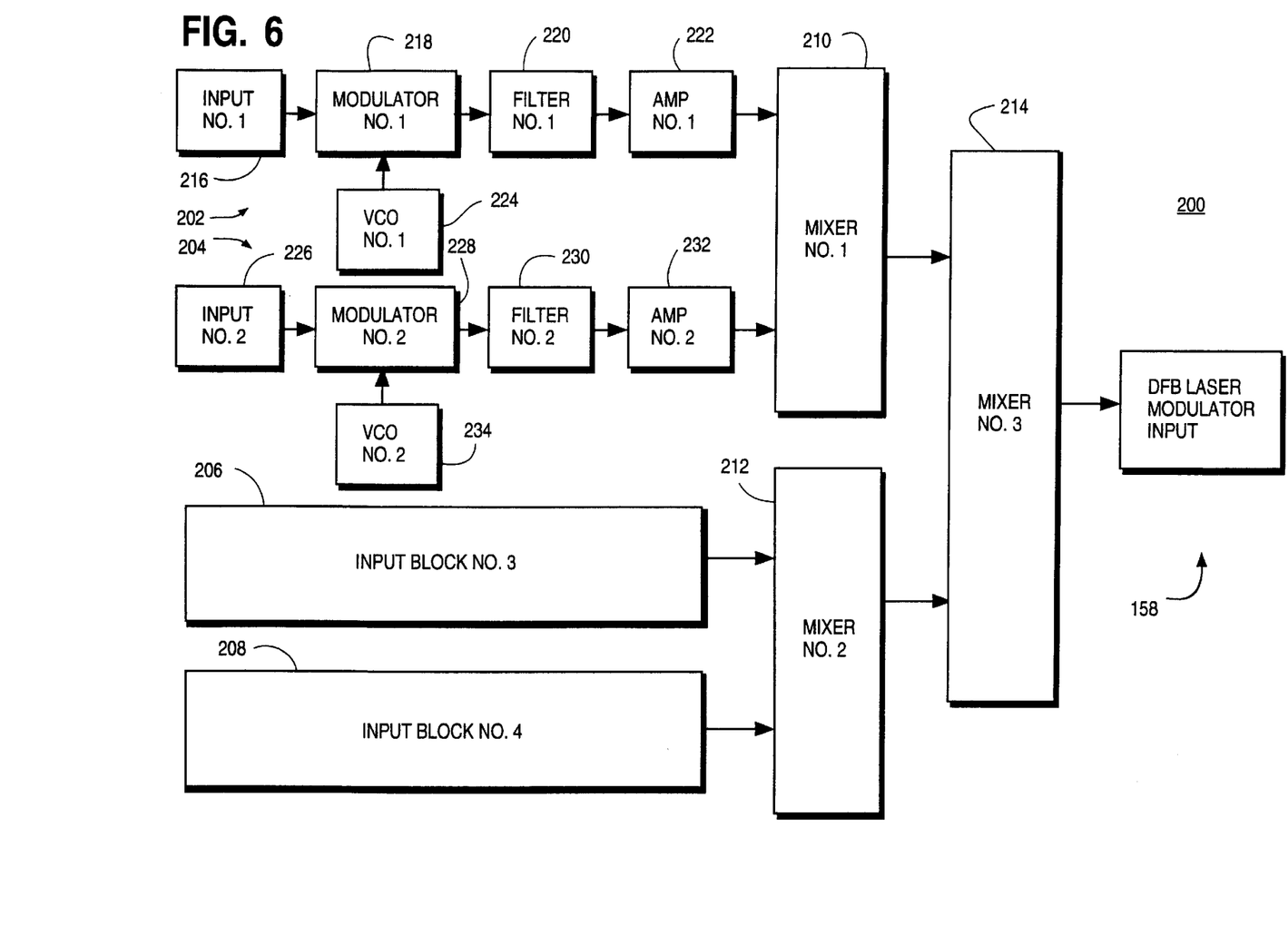
FIG. 6 depicts a block diagram of an electronic modulator version of the system of FIG. 1, under an alternate illustrated embodiment.

Under an alternate illustrated embodiment, the modulation section 16 of FIG. 1 may be implemented as shown in FIG. 6 by the modulation system 200. Under the embodiment, modulation, mixing and frequency translation may be accomplished under a RF format.

As with the modulator 150 of FIG. 5, the modulation of source signals (e.g., 140 - 6.2 MHZ television signals) may be accomplished by first grouping the signals into 1 GHz wide information blocks and then frequency translating the 1 GHz information blocks into non-interfering positions over a transmission spectrum.

In the system 200 shown in FIG. 6, a grouping of signals (e.g., 140) is received as an input 216, 226 by a subchannel 202, 204, 206, 208. Upon receipt of the signal, the signal is modulated by a clock signal from a voltage controlled oscillator (VCO) 224, 234. The magnitudes of the clock signal and groups of signals may be controlled to ensure that the clock signal has a signal level as discussed above of 2–7 times higher than the information block.

As above, the clock frequencies of the VCOs 224, 234 may be chosen to place the blocks of information signals into non-interfering spectral locations of a final drive signal used for modulating the laser 158. Since the blocks of information signals may have a bandwidth of 1 GHz, a clock frequency of the first VCO 224 may be chosen in the area of 2.5 GHz. The clock frequency of the second VCO 234 may be chosen in the area of 3.6 GHz. The clocks of the third and fourth subchannels may be chosen in the areas of 4.7 and 5.8 GHz, respectively. Subchannels 5–16 (not shown) may use similar frequency spacing.

Modulating the block of source signals by the clock signal results in sum and difference signals, as well as a strong signal component at the spectral location of the clock frequency. The modulated signal from the modulator (e.g., 218) is bandpass filtered in a filter 220 to leave the difference and clock components of the modulation step. Amplification with an amplifier 222 may be necessary before combining the modulated signals of each subchannel 202, 204, 206, 208.

Following amplification, the subchannel components may be combined in a set of mixers 210, 212, 214. Since 16 inputs (one from each subchannel) to a single mixer may result in objectional artifacts, a two-step process is used. First pairs of channels 202 and 204, 206 and 208 are mixed in a first set of mixers 210, 212. The final mixing step may occur in a final mixer 214.

Modulation of the mixed signal from the mixer 214 may be applied as an input to the driving modulator 194 of the modulation system 158. As described above, the signal may be applied to a electro-optical differential multiplexer (e.g., a 100 GHz LiNbO$_3$ or GaAs modulator) having an appropriate electro-optical response (e.g., a Marconi LC 1000 Series Special, UTP SITU APE, etc.). Similarly, the driver laser 192 exciting the modulator 194 of the transmission laser 158 of the modulation system 200 may be an infrared DFB laser of a 1.55 μm wavelength.

Figure 7:
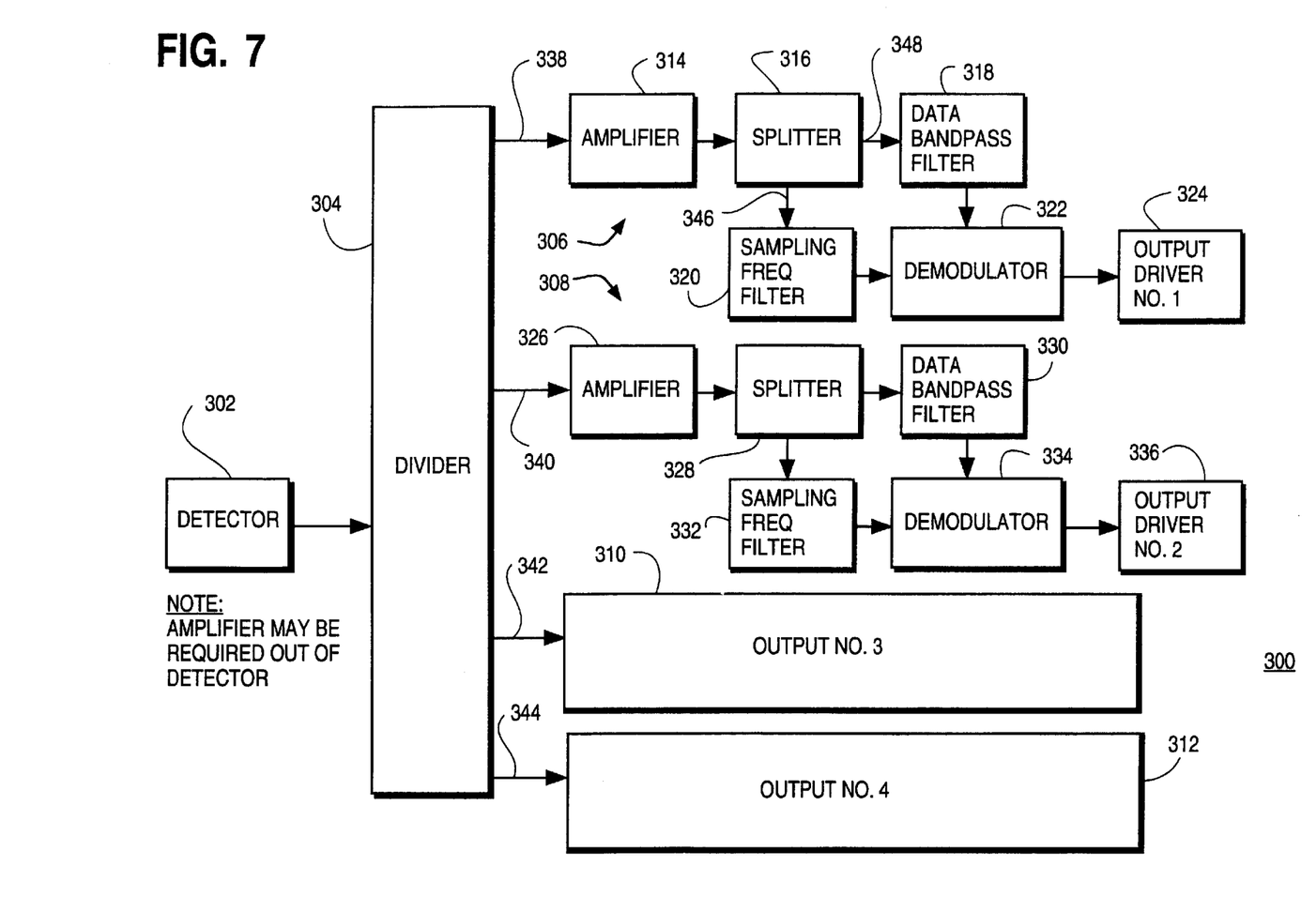
FIG. 7 depicts a block diagram of an electronic demodulator for use with the system of FIG. 1.

FIG. 7 depicts a demodulator 300 in accordance with an illustrated embodiment of the invention. Under the embodiment, a detector detects an optical signal from the fiber 50 and passes the detected signal to a divider 304. Within the divider, a series of subchannel signals are separated from the transmitted signal based upon spectral location. A series of subchannel processors 306, 308, 310, 312 recover a clock signal and function to frequency shift the subchannel signal to a baseband frequency, thereby recovering the block of information signals originally transmitted.

Detection of the transmitted signal from the fiber 50 may be accomplished using a high speed photodiode 302. An integrating sensor having a 60 GHz capability may be selected as being appropriate (e.g., a Newport PX-D7 diode).

The divider 304 functions to divide the signal detected in the detector 302 into a series of spectrally divided constituent parts. Functionally, the divider 304 acts as a multi-band passband filter where a different spectrum of the signal received from the detector 302 is passed to each of its outputs 338, 340, 342, 344. For example, the first subchannel 306 may process a subchannel signal with a clock signal of 2.5 GHz and associated information signal. A second subchannel 308 may process a subchannel signal with a clock frequency of 3.6 GHz.

The passbands of each output 338, 340, 342, 344 of the divider 304 coupled to a respective subchannel 306, 308, 310, 312 may be determined based upon the relative location of the information signal with respect to the clock signal. For example, the first subchannel 306 may operate with a clock frequency of 2.5 GHz and a 1 GHz information signal (including a spectral block of 140 TV signals). When the 1 GHz information signal is encoded using the system 150 of FIG. 5, the 1 GHz signal is centered around the clock signal. In contrast, when the 1 GHz information signal is encoded using the RF process of the system 200 of FIG. 6, the information signal is offset to the spectral location of the difference component of the modulation operation.

Where the optical signal received by the receiver 300 was encoded by the encoder 150, the passband of the first output 338 may be chosen as being in the area of 2.0 to 3.0 GHz. Similarly, the passband of the second output 340 of the divider may be chosen in the area of from 3.1 to 4.1 GHz.

Where the optical signal received by the receiver 300 was encoded by the encoder 200, the passband of the first output 338 may be chosen as being in the area of 1.5 to 2.5 GHz. Similarly, the passband of the second output 340 of the divider may be chosen in the area of from 2.6 to 3.6 GHz.

Following separation of the subchannel components in the divider 304, the subchannel signal may be amplified in an amplifier 314, 326. Following amplification, the subchannel signal enters a splitter 316, 328 where a clock signal may be recovered from the subchannel signal. The splitter 316, 328 may include a pair of notch filters that passes a clock frequency to a sampling frequency filter 320, 332 and attenuates the clock signal from passing to the data bandpass filter 318, 330.

A bandpass filter 318, 330 following the splitter 316, 328 also serves to further attenuate subchannel frequencies outside the proper spectral range. For example, the passband for the first subchannel may be chosen in the range of 1.5 to 2.5 GHz or 2.0 to 3.0 GHz, depending upon the transmitter 150, 200 used. The proper bandwidth of the bandpass filter 318, 332 for purposes of the receiver subchannels 306, 308 would substantially be the 1 GHz bandwidth of the information signals from the signal providers 160, 162, 216, 226 of the transmitters 150, 200.

Within the sampling frequency filter 320, 332 a local voltage controlled oscillator (VCO) 348 (FIG. 8) may be used to duplicate a transmitter clock frequency. For instance, the local VCO 348 of the sampling frequency filter 320 of the first subchannel 306 may be configured to duplicate the clock 172 of the first subchannel 152 of the transmitter 150 or the VCO 224 of the first subchannel 202 of the transmitter 200. Similarly, the local VCO 348 of the second subchannel 308 of the receiver 300 may be configured to duplicate the clock 180 of the second subchannel 154 of the transmitter 150 or the VCO 234 of the second subchannel 204 of the transmitter 200.

Figure 8:
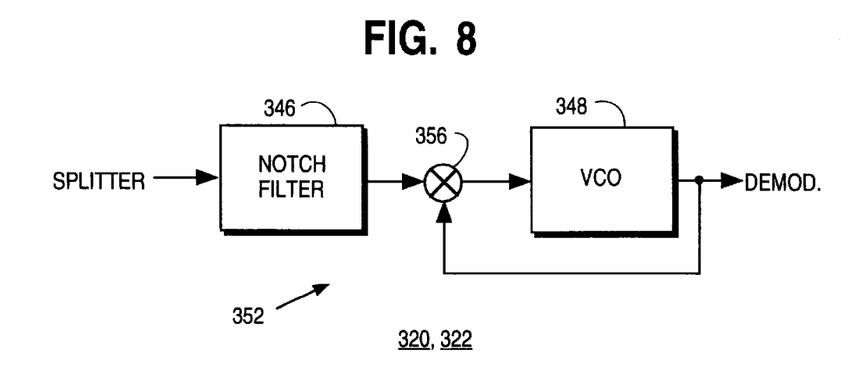
FIG. 8 depicts a block diagram of a sampling clock frequency filter of the system of FIG. 7.

A phase locked loop (PLL) 352 may also be used within the sampling frequency filter 320, 332. The PLL 352 may be used to synchronize the local VCO 348 to the clock frequency recovered in the splitter 316, 328.

Within the demodulator 322, 324, the bandpass filtered, information signal may be translated to a baseband frequency by mixing the information signal from the bandpass filters 318, 330 with the recovered clock frequency from the sampling frequency filter 320, 332. The translated baseband signal may then be low-pass filtered to remove any artifacts associated with demodulation and to recover the originally encoded information signal. An output driver 324, 336 may be used to transfer the recovered information signal to a channel processor for separation of each of the originally encoded (e.g., 140 television) channels.

A specific embodiment of a novel method and apparatus for construction of a stabilized laser according to the present invention has been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention any and all modifications, variations, or equivalents that fall within the true spirit and scope of the basic underlying principles disclosed and claimed herein.

What is claimed is:

1. A method of modulating a laser beam wit a plurality of information signals, such method comprising the steps of: frequency modulating a plurality of coherent, optical signals with a respective information signal of the plurality of information signals; optically refraction synchronizing each frequency modulated optical signal with a respective reference clock frequency; directing the modulated optical signals onto a photodiode; detecting the collected signals in the photodiode; and diffraction multiplexing the laser beam with the detected signals, wherein the respective reference clock frequency of the plurality of coherent, optical signals is obtained by multiplying a clock frequency by a factor of $2^n$, where n is a positive integer, by introducing a phase delay of $2\pi/2^n$ radians between a source of the reference clock frequency and a modulator for modulating a laser beam.

* * * * *